United States Patent
Chang

(10) Patent No.: US 6,972,445 B2
(45) Date of Patent: Dec. 6, 2005

(54) INPUT/OUTPUT STRUCTURE AND INTEGRATED CIRCUIT USING THE SAME

(75) Inventor: Chi Chang, Taipei Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 0 days.

(21) Appl. No.: 10/709,988

(22) Filed: Jun. 11, 2004

(65) Prior Publication Data

US 2005/0073020 A1  Apr. 7, 2005

(51) Int. Cl.$^7$ .............................................. H01L 27/10

(52) U.S. Cl. ...................... 257/203; 257/208; 257/459; 257/676; 257/690; 257/784; 257/786

(58) Field of Search ................................. 257/202, 203, 257/208, 459, 676, 690, 779–784, 786

(56) References Cited

U.S. PATENT DOCUMENTS 6,043,539 A * 3/2000 Sugasawara ................. 257/357
6,242,814 B1 * 6/2001 Bassett ....................... 257/786

* cited by examiner

*Primary Examiner*—Andy Huynh
(74) *Attorney, Agent, or Firm*—Jianq Chyun IP Office

(57) ABSTRACT

An input/output structure for a die to support an Accelerated Graphic Port (AGP) standard and a Peripheral Component Interconnection Express (PCIE) standard is provided. The I/O structure is suitable for the die pad. It comprises: a PCIE input/output pad for supporting PCIE standard; an AGP input/output pad for supporting AGP standard; a die pad coupled to an external circuit; a first conducting distributed wire coupled to the PCIE input/output pad and the die pad; and a second conducting distributed wire coupled to the AGP input/output pad and the die pad; wherein only one of the PCIE input/output pad and the AGP input/output pad is enabled at the same time.

8 Claims, 1 Drawing Sheet

INPUT/OUTPUT STRUCTURE AND INTEGRATED CIRCUIT USING THE SAME

CROSS REFERENCE TO RELATED APPLICATIONS

This application claims the priority benefit of Taiwan application serial no. 92127763, filed Oct. 7, 2003.

BACKGROUND OF INVENTION

1. Field of the Invention

This invention generally relates to an I/O structure in the integrated circuit, and more particularly to an I/O structure for a die using the same die pad to support several interface standards.

2. Description of Related Art

To effectively protect the die from being damaged and to make the die be connected to the external circuit, the packaging technology has been widely used. There are several technologies for chip packaging. For chip bonding technology, wire bonding, flip chip, and tape automatic bonding are the most common bonding technologies, wherein the wire bonding technology is the maturest among these bonding technologies.

For the wire bonding technology, there are several I/O pads on the die. Those I/O pads are coupled to the die pads on the active surface via the conducting wires of the re-distributed layer. Those die pads then are coupled to the bonding pads on the substrate via the conducting wires. Because the I/O pads are, among a plurality of function blocks of the integrated circuit, the last level function block coupled to the external circuit outside the die, they generally provide the buffer-drive function. In addition, to prevent ESD damages the internal circuit coupled to the I/O pads, the I/O pads may also protect the internal circuit from ESD.

Currently, the most common graphic display standards include Accelerated Graphic Port (AGP) interface, Peripheral Component Interconnection Express (PCIE) interface, and Graphics (Gfx) interface. For each different standard, there is a corresponding chipset and a corresponding plug to support it. Hence, it causes the inconvenience of the version control, logistics control and the circuit designs. Therefore, if the graphic or control chip can integrate and support the PCIE interface standard, the AGP interface standard, or even the Gfx interface standard, those standards can share the same bus and the same motherboard.

It is well known that PCIE interface standard and the AGP interface standard have different transmitting/receiving structures. PCIE interface standard uses current source to drive and a very complex serial link technology. The AGP interface standard uses the conventional I/O such as open-drained (AGP 3.0) or push-pull (AGP 2.0) structure. Hence, it is very difficult to integrate these two standards and use the same I/O pad to support PCIE interface standard and the AGP interface standard.

FIG. 1 is a conventional I/O structure supporting a single interface standard. Referring to FIG. 1, the I/O pad 12 on the die 11 only supports either PCIE or AGP standard. The I/O pad 12 is coupled to the die pad 14 on the die 11 via the distributing wire 13 of the redistributed layer. The die pad 14 is coupled to the bonding pad 17 on the substrate via the impending conducting wire 15. As shown in FIG. 1, the I/O pad 12 on the die 11 only supports either PCIE or AGP standard. To support both PCIE and AGP standards at the same time, two I/O structures of FIG. 1 are required. I.e. at least two sets of die pads, impending conducting wires and bonding pads are required. Hence, the layout and the circuit design would be very complicated, which causes the design and manufacturing of the motherboards too complicated.

SUMMARY OF INVENTION

An object of the present invention is to provide an I/O structure and IC using the same to support several standards such as PCIE and AGP interface standards. The IC having the I/O structure shares the same conducting wires, the same bonding pads, and the same substrate so that the device applying the IC can use the same buses and the same motherboard to reduce the costs and simplify the design. In addition, the number of the die pads can be saved for the die pads for power source and ground purpose.

The present invention provides an input/output structure for a die to support an Accelerated Graphic Port (AGP) standard and a Peripheral Component Interconnection Express (PCIE) standard, comprising: a PCIE input/output pad for supporting PCIE standard; an AGP input/output pad for supporting AGP standard; a die pad coupled to an external circuit; a first conducting distributed wire coupled to the PCIE input/output pad and the die pad; and a second conducting distributed wire coupled to the AGP input/output pad and the die pad; wherein only one of the PCIE input/output pad and the AGP input/output pad is enabled at the same time.

In a preferred embodiment of the present invention, the PCIE input/output pad and the AGP input/output pad are controlled by an enable signal so that when the PCIE input/output pad is enabled, the AGP input/output pad is disabled, when the AGP input/output pad is enabled, the PCIE input/output pad is disabled. Further, the first and second conducting distributed wires are in the redistributed layer of the die.

One skilled in the art would know that the PCIE input/output pad and the AGP input/output pad can be the input/output pads of other standards and thus they are within the scope of the present invention.

The I/O structure of the present invention connects the PCIE I/O pad and the AGP I/O pad to the same die pad. Hence, the IC using the I/O structure can support several standards, and both standards can share the same conducting wire, the same bonding pad and the same substrate. The device using the IC only uses the same bus layout and the same motherboard to support several standards. In addition, the number of the die pads can be reduced for other uses such as power pads and ground pads.

The above is a brief description of some deficiencies in the prior art and advantages of the present invention. Other features, advantages and embodiments of the invention will be apparent to those skilled in the art from the following description, accompanying drawings and appended claims. In the figures, when the device is "connected" or "coupled" to another device, the device can be directed connected or coupled to another device, or there are other devices between the two devices. On the contrary, when the device is "directly connected" or "directly coupled" to another device, there is no other device between the two devices.

DETAILED DESCRIPTION

Figure 1:
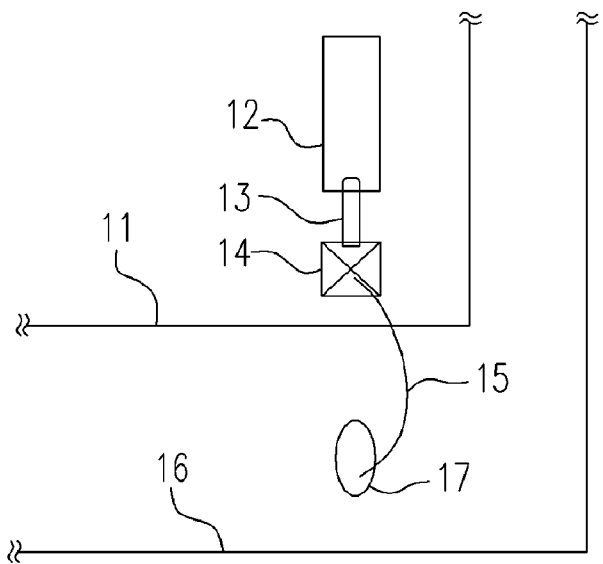
FIG. 1 is a conventional I/O structure supporting a single interface standard.
Figure 2:
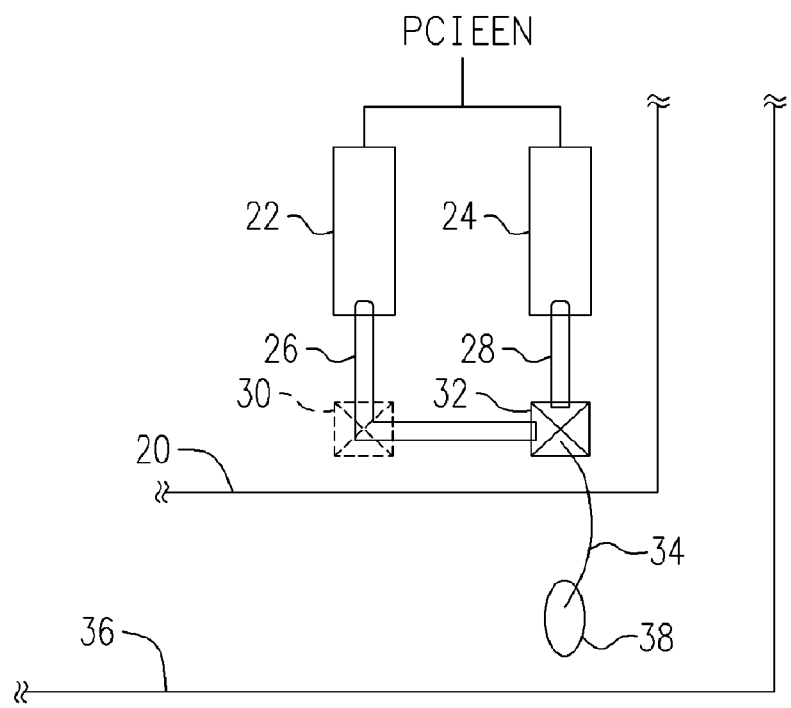
FIG. 2 is an I/O structure supporting a plurality of interface standards in accordance with a preferred embodiment of the present invention.

FIG. 2 is an I/O structure supporting a plurality of interface standards in accordance with a preferred embodiment of the present invention. In this embodiment, we use the PCIE and AGP standards as examples. It is well known that PCIE standard and the AGP standard have different transmitting/receiving structures. PCIE standard uses current source to drive and a very complex serial link technology. The AGP standard uses the conventional I/O such as open-drained (AGP 3.0) or push-pull (AGP 2.0) structure. Hence, it is very difficult to integrate these two standards and use the same I/O pad to support PCIE standard and the AGP standard. Therefore, the present invention does not integrate both standards into the same I/O pad. The present invention keeps the PCIE I/O pad and the AGP I/O pad intact so that the driving ability and the ESD protection of the I/O pads will not be affected.

Referring to FIG. 2, the I/O structure for the die 20 can support two standards such as PCIE and AGP. The I/O structure includes a PCIE input/output pad 24 for supporting PCIE standard, an AGP input/output pad 22 for supporting AGP standard, a die pad 32 coupled to an external circuit, a first conducting distributed wire 28 coupled to the PCIE input/output pad 24 and the die pad 32; and a second conducting distributed wire 26 coupled to the AGP input/output pad 22 and the die pad 32. The first and second conducting distributed wires are in a redistributed layer of the die 20.

Because the I/O pads are the last level function block connected to the external circuit outside the die, the I/O pads have to provide the I/O buffer-driving ability and ESD protection. Hence, the PCIE input/output pad 24 and the AGP input/output pad 22 are the buffer-drive level for the PCIE and AGP signals, respectively. Because both the PCIE input/output pad 24 and the AGP input/output pad 22 are connected to the die pad 32, only one of the PCIE input/output pad 24 and the AGP input/output pad 22 is enabled at the same time for performing input/output function. In this embodiment, the PCIE input/output pad 24 and the AGP input/output pad 22 are controlled by an enable signal PCIEEN so that when the PCIE input/output pad 24 is enabled, the AGP input/output pad 22 is disabled; when the AGP input/output pad 22 is enabled, the PCIE input/output pad 24 is disabled.

Generally, each I/O pad is corresponding to a die pad to send the signal out to the external circuit. In this embodiment, the die pad 32 is corresponding to the PCIE I/O pad 24. The die pad 32 is coupled to the bonding pad 38 of the substrate 36 via a impending conducting wire 34 as the bridge for the input or output signals. As shown in FIG. 2, because the AGP I/O pad 22 is coupled to the die pad 32 via the second conducting distributed wire 26, the die pad 30 becomes redundant. Hence the die pad 30 can be for other uses such as power pad or ground pad.

One skilled in the art would know that the PCIE input/output pad and the AGP input/output pad can be the input/output pads of other standards and thus they are within the scope of the present invention. Other standards such as Gfx also can be integrated into the I/O structure of the present invention. In this situation, the I/O structure of the present invention and the integrated circuit applying the I/O structure are within the scope of the present invention.

The I/O structure of the present invention connects the PCIE I/O pad and the AGP I/O pad to the same die pad via the conducting distributed wire. Hence, the integrated circuit using the I/O structure can support a plurality of standards, and both standards can share the same conducting wire, the same bonding pad, and the same substrate. The device using the IC can use the same bus layout and the same motherboard to support several standards. In addition, the number of the die pads can be reduced for other uses such as power pads and ground pads.

The above description provides a full and complete description of the preferred embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. An input/output structure for a die to support an Accelerated Graphic Port (AGP) standard and a Peripheral Component Interconnection Express (PCIE) standard, comprising:
   a PCIE input/output pad for supporting PCIE standard;
   an AGP input/output pad for supporting AGP standard;
   a die pad coupled to an external circuit;
   a first conducting distributed wire coupled to said PCIE input/output pad and said die pad; and
   a second conducting distributed wire coupled to said AGP input/output pad and said die pad;
   wherein only one of said PCIE input/output pad and said AGP input/output pad is enabled at the same time.

2. The structure of claim 1, wherein said PCIE input/output pad and said AGP input/output pad are controlled by an enable signal so that when said PCIE input/output pad is enabled, said AGP input/output pad is disabled, when said AGP input/output pad is enabled, said PCIE input/output pad is disabled.

3. The structure of claim 1, wherein said die pad is coupled to a bonding pad of a substrate via a conducting wire.

4. The structure of claim 1, wherein said first and second conducting distributed wires are in a re-distributed layer.

5. An input/output structure for a die to support a plurality of standards, comprising:
   a first input/output pad for supporting a first standard;
   a second input/output pad for supporting a second standard;
   a die pad coupled to an external circuit;
   a first conducting distributed wire coupled to said first input/output pad and said die pad; and
   a second conducting distributed wire coupled to said second input/output pad and said die pad;
   wherein only one of said first input/output pad and said second input/output pad is enabled at the same time.

6. The structure of claim 5, wherein said first input/output pad and said second input/output pad are controlled by an enable signal so that when said first input/output pad is enabled, said second input/output pad is disabled, when said second input/output pad is enabled, said first input/output pad is disabled.

7. The structure of claim 5, wherein said die pad is coupled to a bonding pad of a substrate via a conducting wire.

8. The structure of claim 5, wherein said first and second conducting distributed wires are in a re-distributed layer.

* * * * *